United States Patent
Van Hoff

(10) Patent No.: US 6,727,115 B2
(45) Date of Patent: Apr. 27, 2004

(54) BACK-SIDE THROUGH-HOLE INTERCONNECTION OF A DIE TO A SUBSTRATE

(75) Inventor: Jay F. Van Hoff, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/000,008

(22) Filed: Oct. 31, 2001

(65) Prior Publication Data
US 2003/0082851 A1 May 1, 2003

(51) Int. Cl.⁷ .................. H01L 21/44; H01L 21/48; H01L 21/50
(52) U.S. Cl. .................. 438/106; 438/107; 438/117
(58) Field of Search .................. 438/106, 107, 438/117, 127, 21

(56) References Cited

U.S. PATENT DOCUMENTS

| | | | |
|---|---|---|---|
| 5,137,836 A | * 8/1992 | Lam | 438/15 |
| 5,416,971 A | 5/1995 | Hegazi et al. | 29/840 |
| 5,608,264 A | * 3/1997 | Gaul | 257/734 |
| 6,033,935 A | * 3/2000 | Dozier et al. | 438/117 |
| 6,071,427 A | * 6/2000 | Raulinaitis | 216/27 |
| 6,078,186 A | 6/2000 | Hembree et al. | 324/755 |
| 6,107,109 A | 8/2000 | Akram et al. | 438/15 |
| 6,281,576 B1 | * 8/2001 | Hakey et al. | 257/723 |

* cited by examiner

Primary Examiner—Richard Elms
Assistant Examiner—Beth E. Owens

(57) ABSTRACT

A method and apparatus for connecting a die having active circuitry to a substrate in semiconductor applications and in thermal inkjet printer applications where the die is directly bonded and sealed to the substrate without the need for conventional TAB circuit. Each die includes a back-side and a front-side, where the active circuitry is positioned, with at least one through-hole formed between the front-side and the back-side of the die. Each through-hole on the die is aligned with a corresponding conductive trace on the substrate. A conductive member is inserted within each through-hole. One end of the conductive member is electrically connected to a trace on the substrate. The other end of the conductive member is inserted into the through-hole such that the conductive member is positioned through the die and is exposed at the front-side of the die to contact an interconnect pad, which is electrically connected to the active circuitry on the die. The back-side of the die is bonded and sealed to the substrate. The interconnect pad and exposed end of the conductive member is sealed to substantially hermetically seal the resulting electrical connection from the active circuitry to the trace.

16 Claims, 19 Drawing Sheets

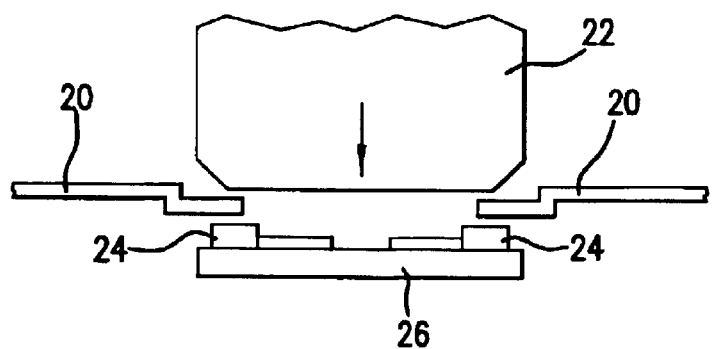
FIG.5
PRIOR ART
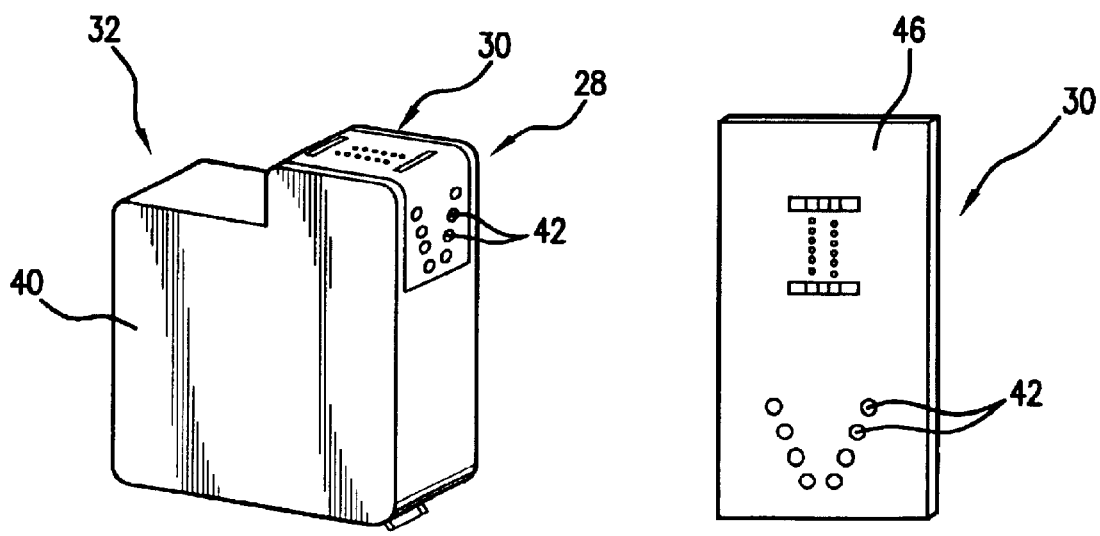
FIG.6
PRIOR ART
FIG.7
PRIOR ART

BACK-SIDE THROUGH-HOLE INTERCONNECTION OF A DIE TO A SUBSTRATE

TECHNICAL FIELD

The present invention generally relates to connecting chips or dies to substrates, and, particularly, electrically connecting and bonding the back-side of a die directly to a substrate and protecting conductive traces from contaminants in semiconductor and thermal inkjet printer applications.

BACKGROUND OF THE INVENTION

One of ordinary skill in the art in semiconductor technology readily understands that integrated circuits (ICs) are formed in and on wafers made from semiconductor material (s) as one of the basic steps of microchip fabrication. The area on a wafer occupied by a discrete IC is called a chip or a die. In the wafer fabrication process, the discrete ICs are formed in and on the wafer surface and are wired together. The resulting circuit is protected with a final sealing layer. Following wafer fabrication, the chips on the wafer are complete, but in untested wafer form.

To use a chip for its intended purpose, such as part of an electronic circuit or electronic product, the chip is packaged in a usable form that provides a lead system to connect the chip to a circuit board or directly to an electronic device. Moreover, the package provides physical protection for the fragile chip, including environmental protection and heat dissipation. An example of a packaged chip 2 is shown in Prior Art FIG. 1.

In the packaging process, the wafer is separated into individual chips or dies through sawing, etching, or scribing. The die needs to be electrically connected and bonded to its substrate prior to packaging and use. This has been accomplished by using an adhesive, such as a gold/silicon eutectic or an epoxy adhesive, to attach the die to the substrate. Electrical connections are then made on the front-side of the die, such as the individual wire bonding shown in Prior Art FIG. 2, where up to hundreds of thin wires 4 (only one shown) electrically connect a interconnect pad 6 on the front-side 10 of chip 2 to a lead 8 on a substrate or package 12 (shown in FIG. 1). The individual wires are expensive and fragile. Moreover, the profile height is relatively high compared to other bonding techniques, which makes this method undesirable for small/shallow package applications.

Another known means for electrically connecting a die to a substrate is via a flip-chip/bump process. This is best seen in FIGS. 3 and 4, where a metal bump 14 is deposited on each bonding pad on the front-side 10 of chip 2 in lieu of wires. The chip 2 is connected to the substrate 16 by flipping the chip 2 over and soldering the bumps 14 to corresponding substrate inner leads 18. This technique has a lower profile than the wire bonding, but is still not ideal for many applications, and, particularly, in corrosive applications.

Referring to Prior Art FIG. 5, another well-known means for electrically connecting a die to a substrate, and most popular in thermal inkjet printhead applications, is the TAB (tape automated bonding) technique. TAB uses flexible continuous tape 20 containing many individual lead systems on the tape. The bond is complete when heat and pressure (such as from a thermode shown at 22) is applied to the tape 20 to physically and electrically bond the inner leads onto the interconnect pads or bonding pads 24 of chip 26. TAB is used extensively in low profile devices. Also, this technique is fast and cost-effective. A major drawback of TAB is the deterioration of the adhesives, and, ultimately, the electrical connections/bonds over time when exposed to corrosive contaminants.

As alluded to above, TAB connections are heavily used in thermal inkjet printer technology because of the low profile that can be obtained with TAB, as well as the speed in which the bonds can be made between the die and substrate during manufacture. Prior Art FIGS. 6–13 are disclosed herein to better educate the reader as to how TAB bonds have been conventionally used in thermal inkjet printers. FIGS. 6–12 are part of the common assignee's U.S. Pat. No. 5,420,627 (inventors Keefe et al.), granted May 30, 1995, and entitled 'Inkjet Printhead."

Exemplary of the TAB circuits in thermal inkjet printheads, as can be see in FIG. 9, a printhead 28 comprising a TAB circuit 30 is incorporated into a print cartridge 32. The printhead, or pen, consists of a fluid (ink)-ejecting substrate 34 having a plurality of nozzles 36 within an orifice plate 38. The fluid-ejecting substrate is fluidically coupled to a reservoir of ink ((either within the cartridge, shown generally at 40, or externally (not shown)). Contact pads 42 carry electrical signals from a microprocessor in the printer to the IC in the die of the printhead to send signals, in the form of current, to specific resistors (not shown) associated with the nozzles 36, typically one nozzle per resistor. The control of specific resistors forms droplets of ink 44 that are ejected through the nozzles 36 onto print media, such as paper. The resistors also heat the droplets such that they dry on contact or near contact on the print media.

The TAB circuit 30 comprises a flexible tape 46. The back-side of the tape 48 includes a plurality of conductive traces 50, which are commonly copper and highly-susceptible to corrosion. Substrate 52, which contains a plurality of the heater resistors, is mounted onto the back-side of tape 46. The substrate 52 is bonded and electrically connected to traces on the tape via electrodes, which would be beneath windows 54.

The interconnect or interconnect pads are sealed or encapsulated, such as enumerated at 56 in FIG. 11, to protect the integrity of the electrical connection. Thus, encapsulation is typically used over the interconnect pads. This forms an encapsulant bead 58, which is exemplified in FIG. 13. The encapsulant bead has a profile height of "h" (in the range of 0.5 mm) that must be taken into account when positioning the fluid-ejecting substrate of the printhead relative to the print media.

Referring also to FIG. 27, it is desirable to have the print media be as physically close to the nozzles of the fluid-ejecting substrate as possible (also called pen to paper spacing or PPS), taking into account that the print media type will require some clearance for issues such as paper cockle, envelope seams, and the like, (which is also in the range of 0.5 mm). By eliminating unnecessary encapsulation or bead height, or other profile height within the printhead, the conventional distance between the printhead and print media of 1.0 mm can be reduced by as much as approximately 0.5 mm. This close tolerance is highly desired as print quality is enhanced when the distance between the fluid-ejecting substrate and the print media is reduced.

SUMMARY OF THE INVENTION

The present invention is directed to a method for electrically connecting a chip or die having active circuitry to a substrate, whether in semiconductor applications or in thermal inkjet printer applications, without the need for TAB as a bonding means between the die and substrate. Each die includes a front-side and a back-side. At least one through-hole is formed within the die between the front-side and the back-side. Each aperture is aligned with a conductive trace on the substrate. A conductive member is inserted through a corresponding through-hole from the back-side of the die. One end of the conductive member is electrically connected to its corresponding trace. The conductive member is inserted through the die such that other end of the conductive member is exposed at the front-side of the die to contact an interconnect pad that is electrically connected to the active circuitry of the die.

The back-side of the die is bonded and sealed to the substrate about the at least one conductive member. A sealant is applied to the interconnect pad to substantially hermetically seal the electrical connection between the active circuitry and the trace.

BRIEF DESCRIPTION OF THE DRAWINGS

Like reference numerals are used to designate like parts throughout the several views of the drawings, wherein:

FIG. 5 is a section view of a Prior Art TAB bonding technique;

FIG. 6 is a perspective view of a Prior Art inkjet cartridge for a thermal inkjet printer;

FIG. 7 is a perspective view of the front surface of the Prior Art TAB printhead assembly removed from the cartridge of FIG. 6;

DETAILED DESCRIPTION OF THE PREFERRED EMBODIMENT

Figure 1:
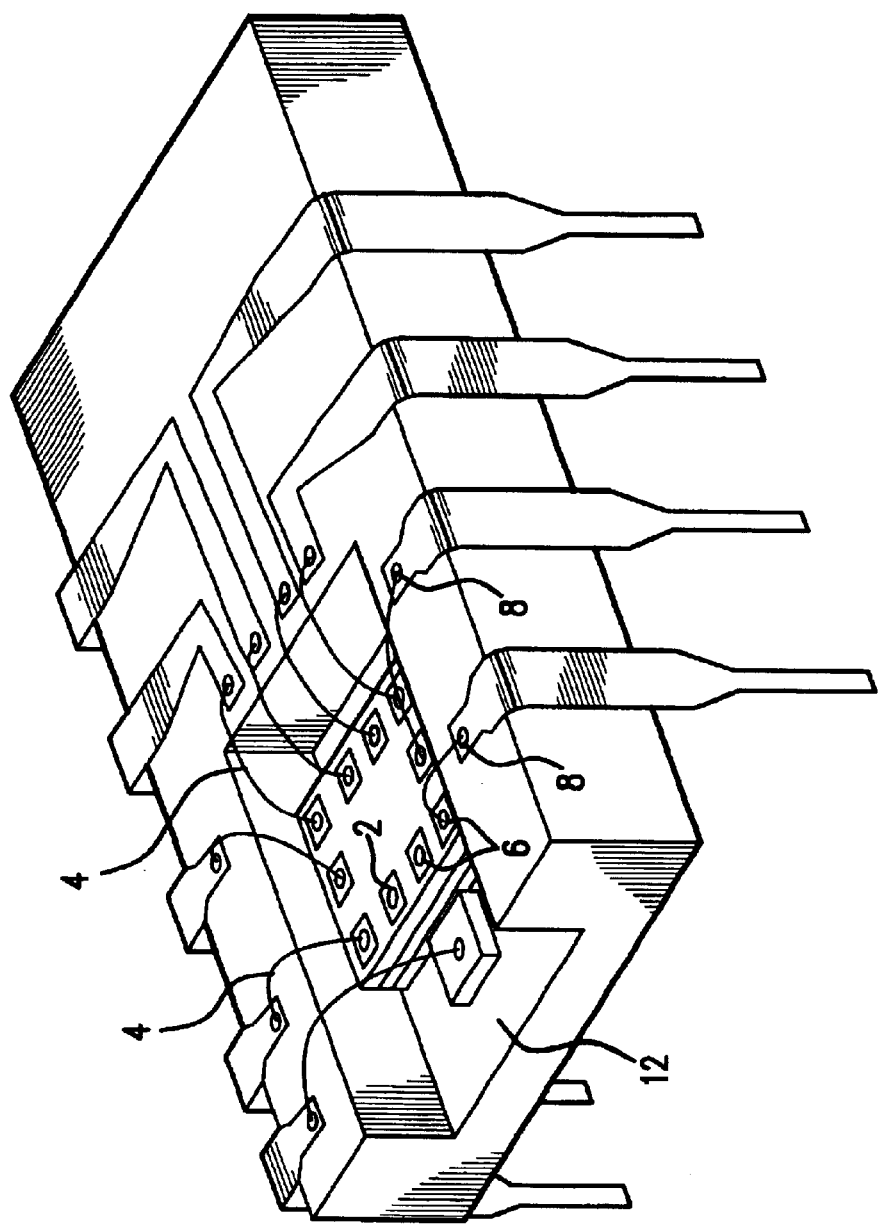
FIG. 1 is an exploded perspective view of the a Prior Art packaged microchip.
Figure 2:
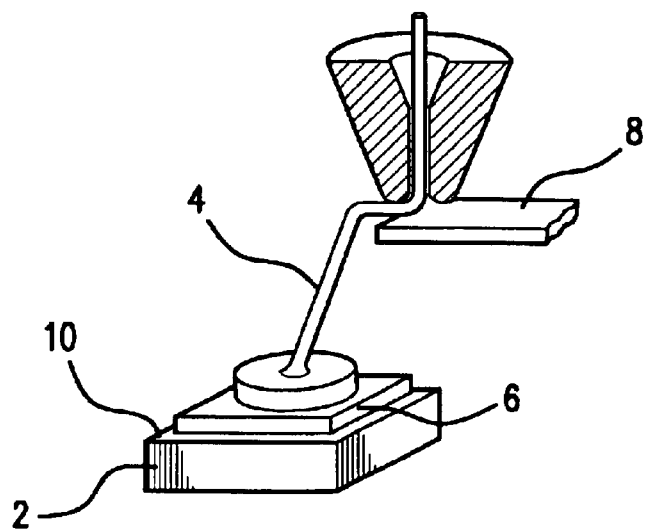
FIG. 2 is a schematic view of a Prior Art bonding technique.
Figure 3:
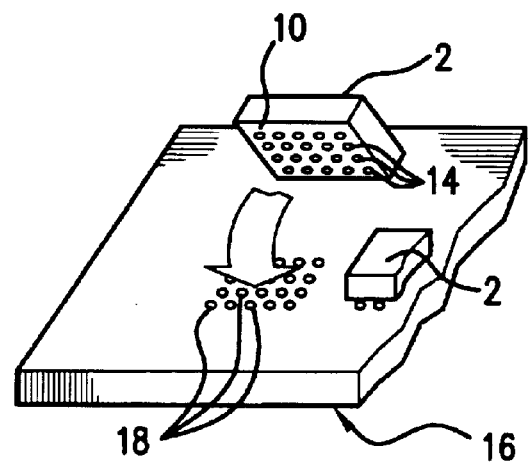
FIG. 3 is a schematic view of a Prior Art flip-chip/bump bonding technique.
Figure 4:
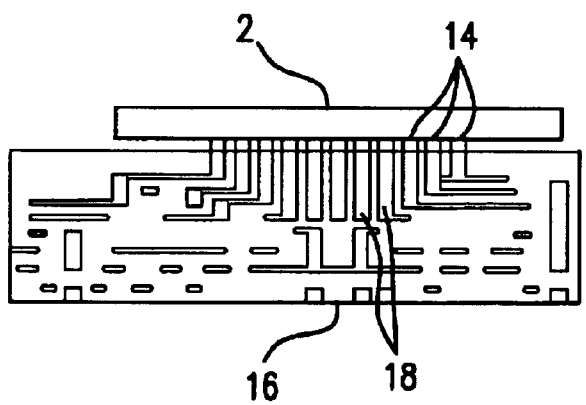
FIG. 4 is a perspective view of a Prior Art flip-chip/bump bonding technique once the chip is flipped over.
Figure 8:
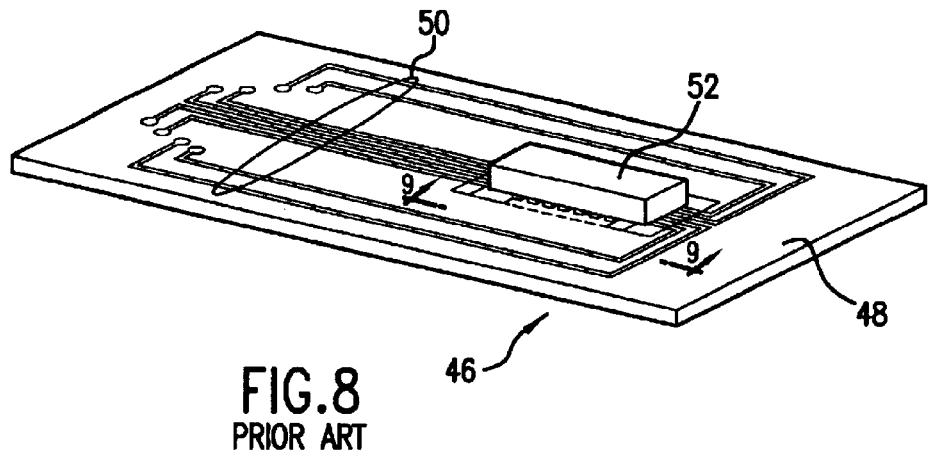
FIG. 8 is a perspective view of the back surface of the Prior Art TAB printhead assembly of FIG. 7 shown with a silicon substrate mounted thereon and conductive leads attached to the substrate.
Figure 9:
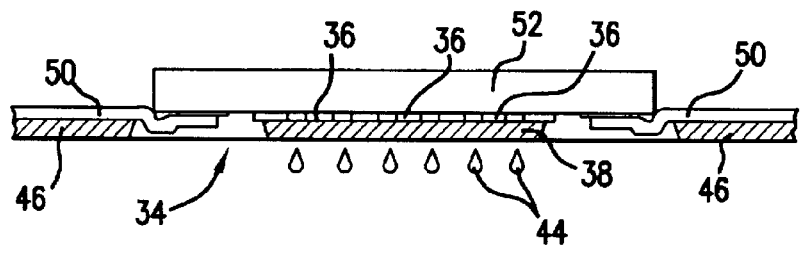
FIG. 9 is a section view taken along lines 9—9 of FIG. 8 illustrating the attachment of conductive leads to electrodes on the substrate.
Figure 10:
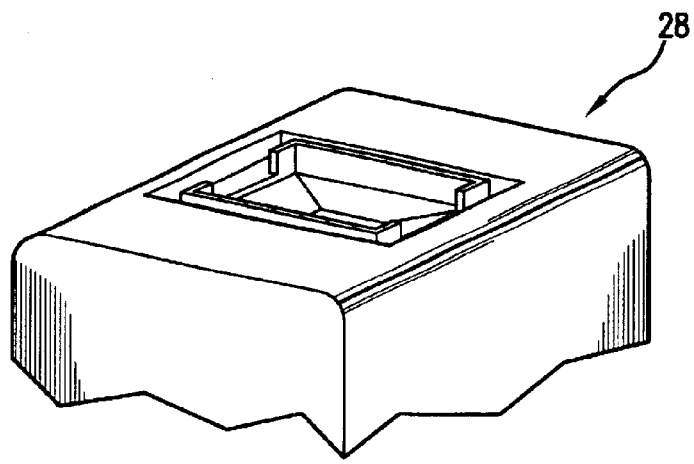
FIG. 10 is a perspective view of a portion of the Prior Art inkjet print cartridge of FIG. 6 with the TAB printhead assembly removed.
Figure 11:
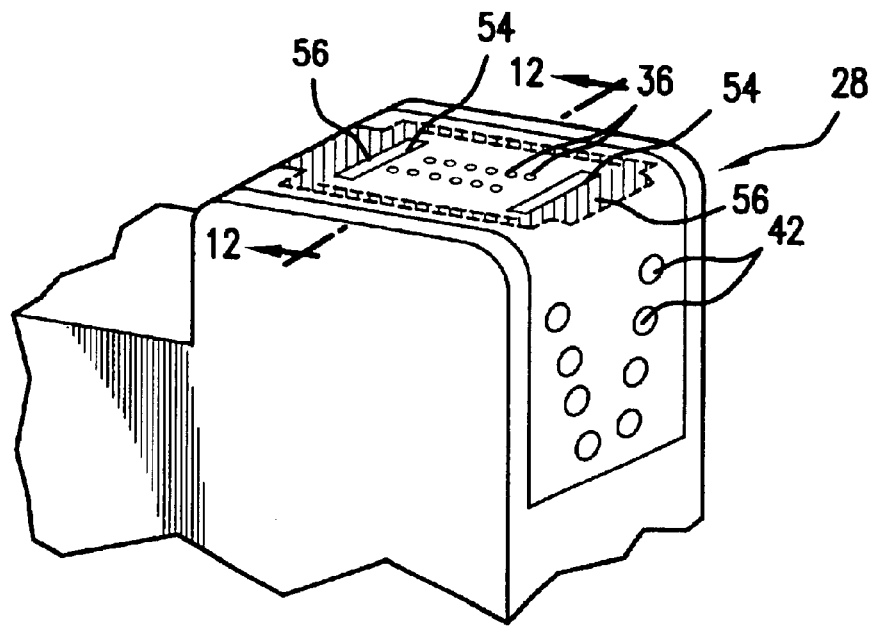
FIG. 11 is a perspective view of a portion of the inkjet print cartridge of FIG. 6 illustrating the configuration of a seal that is formed between the ink cartridge body and the TAB head assembly.
Figure 12:
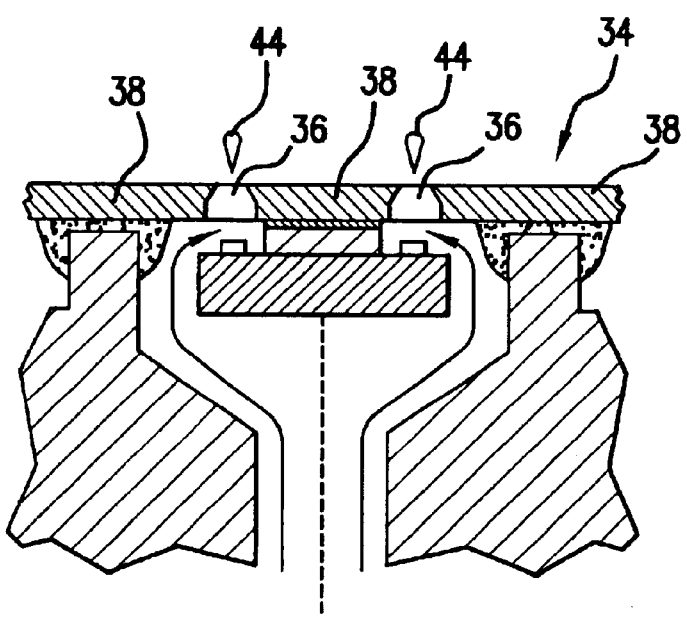
FIG. 12 is a schematic section view taken along 12—12 of FIG. 11 showing the seal between the TAB printhead assembly and the print cartridge as well as the ink flow path around the edges of the substrate.
Figure 13:
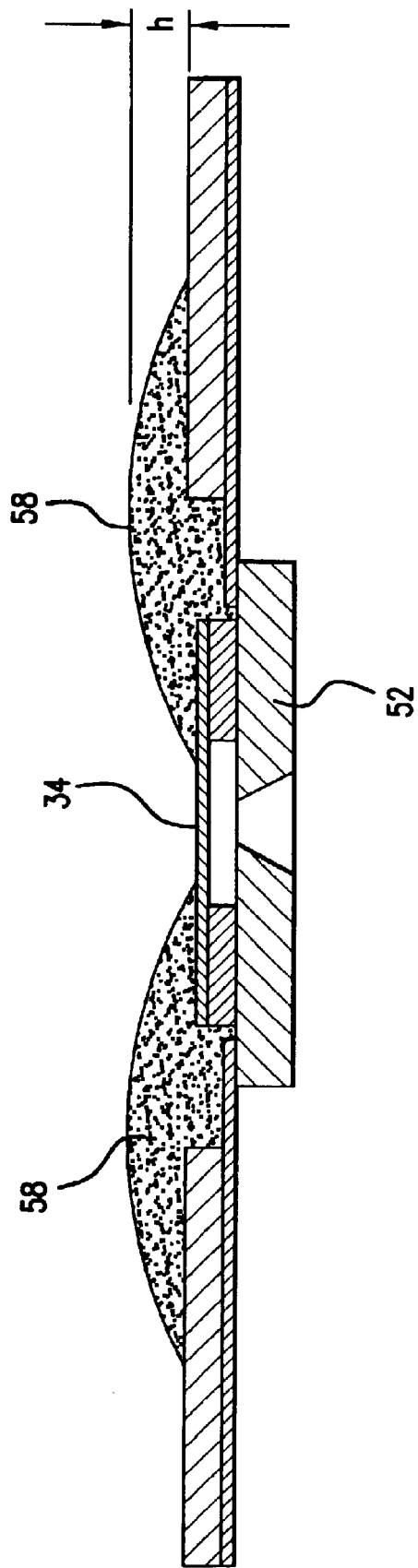
FIG. 13 is a section view of a Prior Art TAB printhead assembly view, similar to the one of the Prior Art FIG. 12 and illustrating an encapsulant bead profile height.
Figure 14:
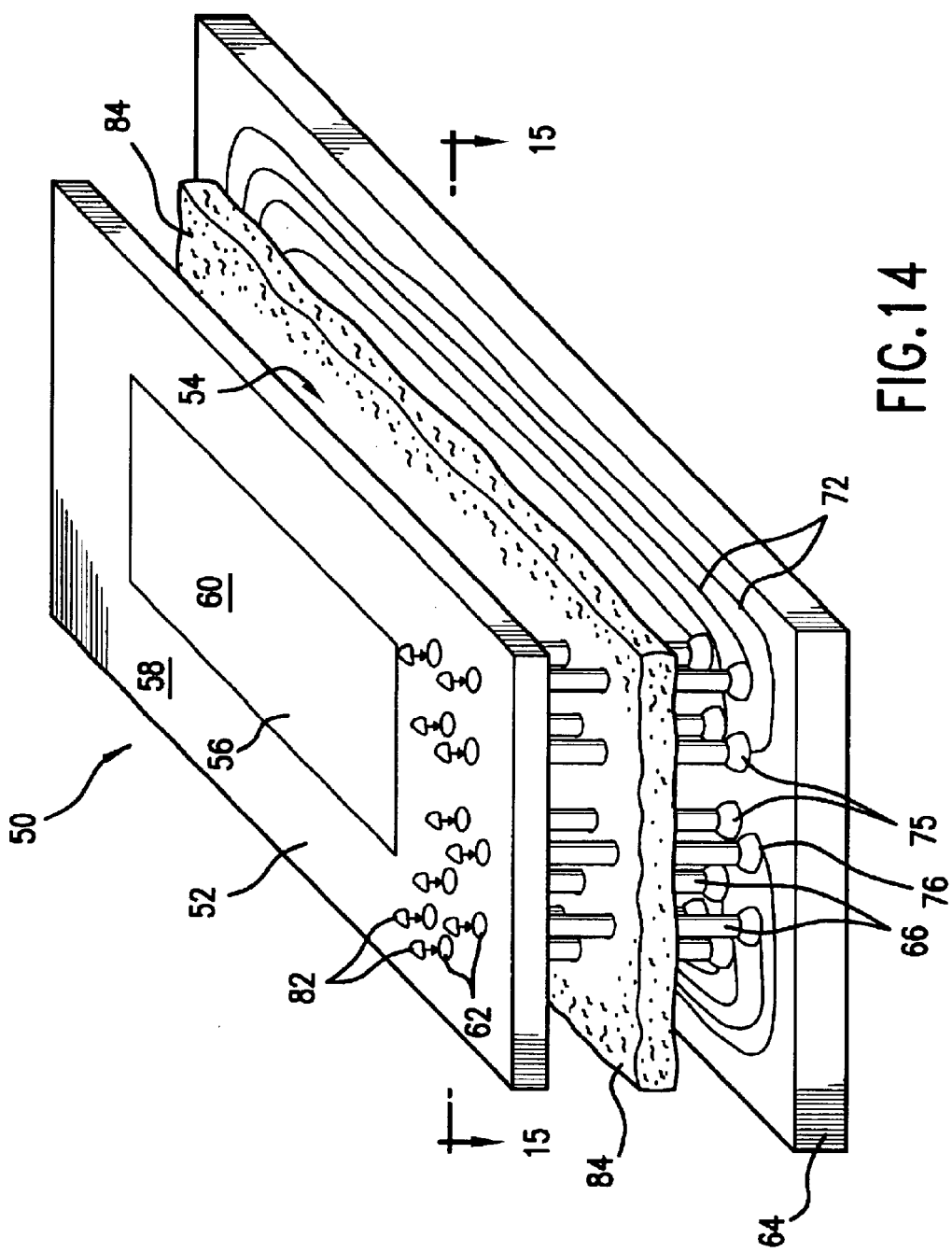
FIG. 14 is an exploded perspective view of a die and substrate of a first embodiment of the present invention.

The present invention is directed to a new method of interconnecting microchips (or dies) having active circuitry to substrates, other protective packages, or printed circuit boards, without the need for conventional TAB circuits. Referring to FIG. 14, the chip or die 50 has a front-side 52 and a back-side 54. Each die includes the active circuitry 56 of the integrated circuit (or IC), or some other discrete device, which is connected to the front-side 52 of die 50. As shown in FIG. 14, the active circuitry may be physically embedded within the die such that the die front-side surface 58 is substantially co-planar with the front-side surface 60 of the active circuitry. This physical relationship has value in at least one species embodiment of which is discussed further below.

A plurality of through-holes 62, or apertures, is formed within die 50 between front-side 52 and back-side 54. The through-holes are preferably formed through laser ablation, although other methods commonly known in the industry, such as electro-chemical etching, dry etching, or sand drilling, may be used.

Figure 15:
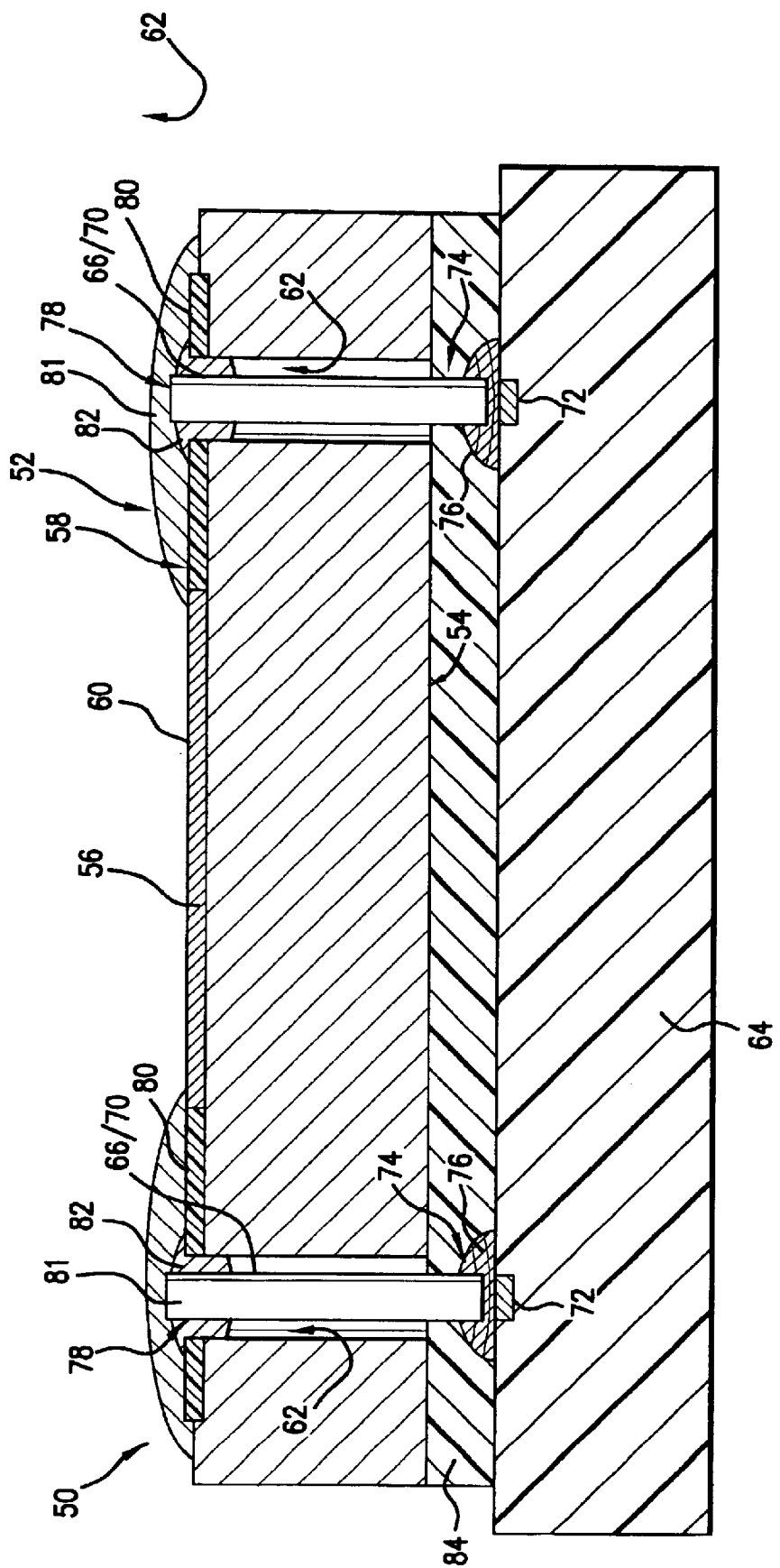
FIG. 15 is a section view taken along lines 15—15 of FIG. 14.
Figure 16:
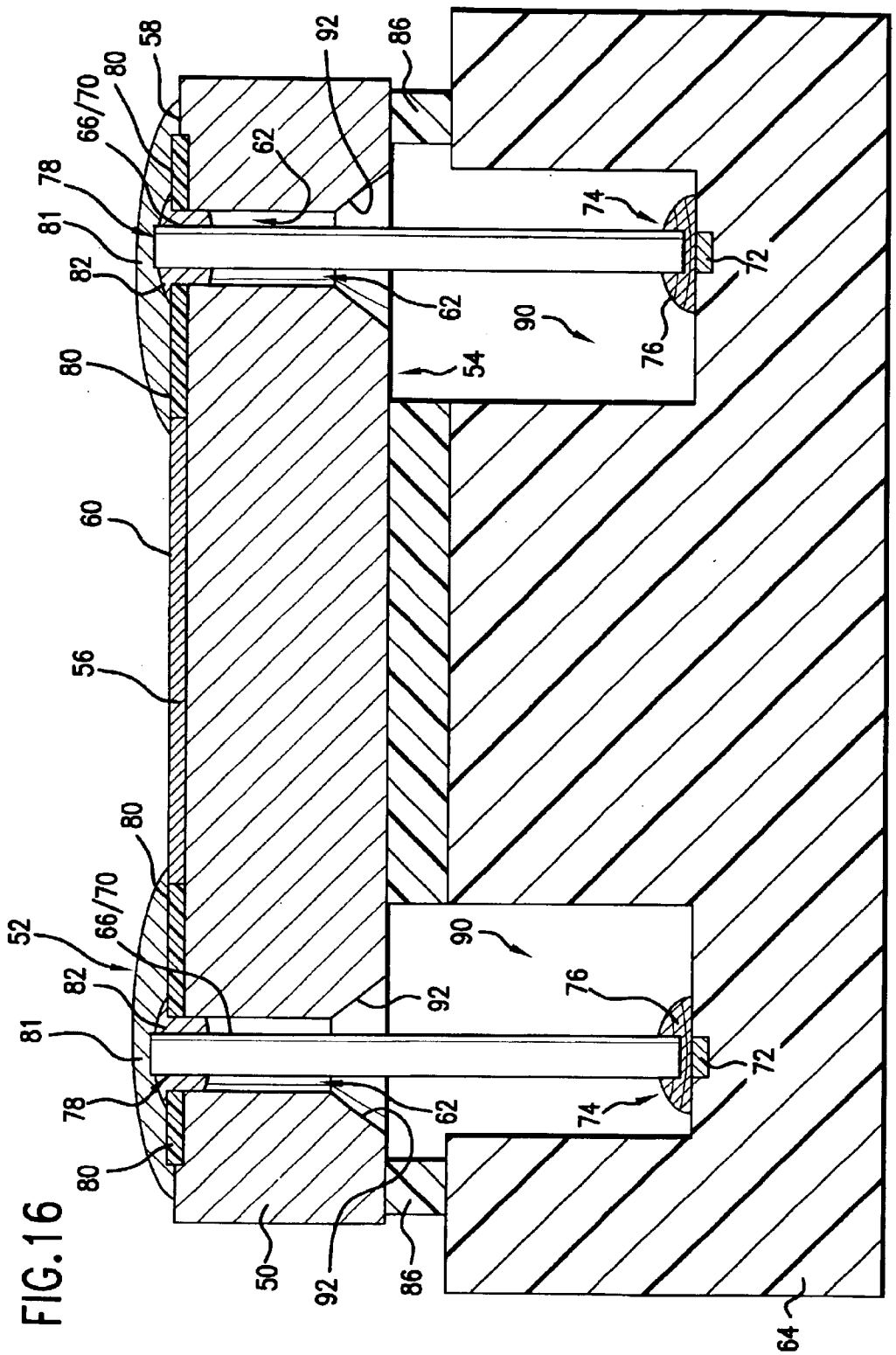
FIG. 16 is a section view disclosing a second embodiment.
Figure 17:
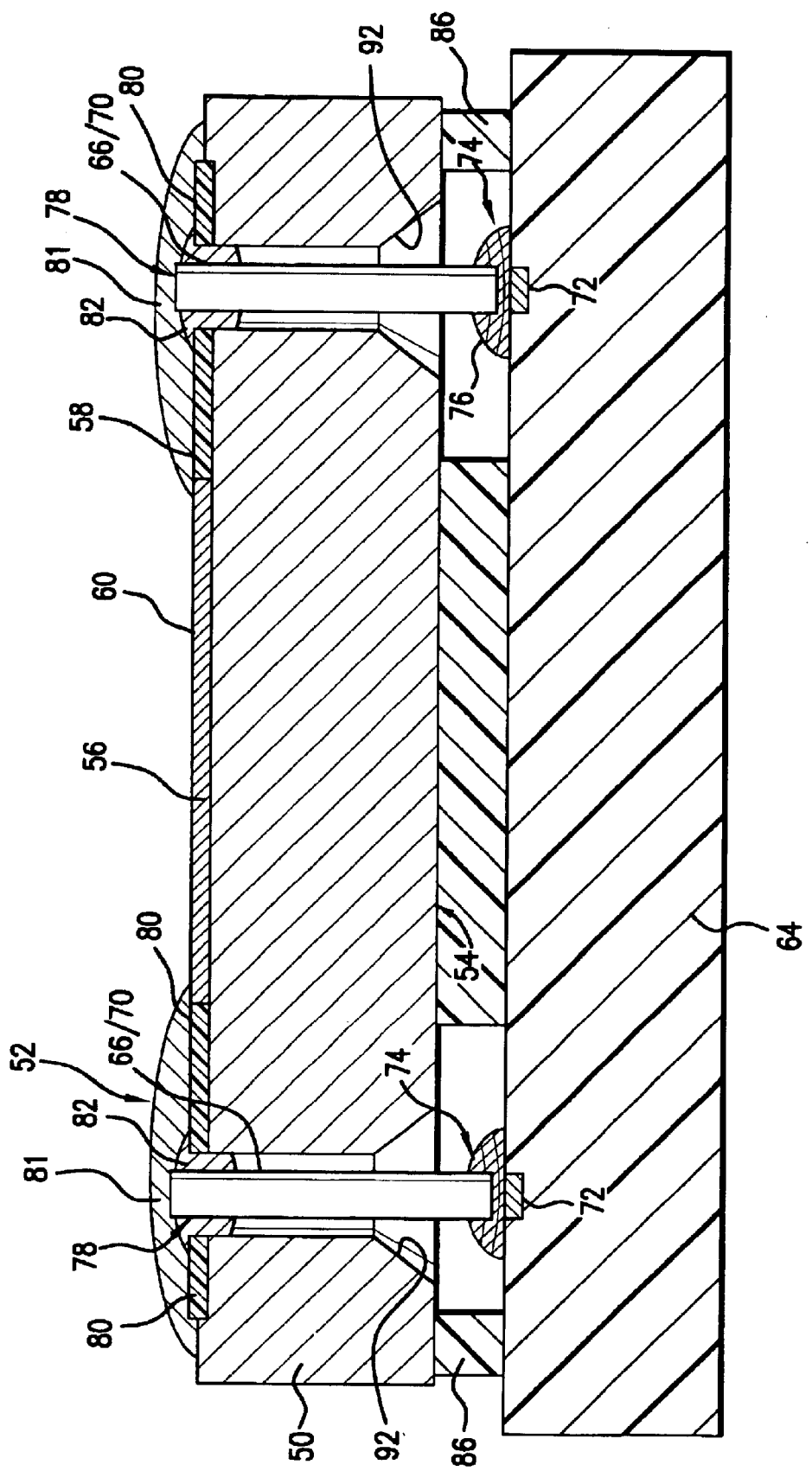
FIG. 17 is a section view disclosing a third embodiment.

Referring also to FIG. 15, die 50 is connected to a substrate 64 via conductive members 66, which electrically connects the substrate 64 to the die 50. Each conductive member 66 is part of the physical joining of the die to the substrate, as well. Each conductive member 66, which may be an insulated gold micro-spring 68, such as sold under the FORMFACTOR trademark (FIGS. 18–19) or an insulated post 70, such as shown in FIGS. 15–17, is connected to a conductive trace 72 on the substrate 64 at one end 74 of the conductive member 66. Each trace is electrically connected to a larger contact 75, which is, in turn, electrically connected to a power supply or electrical components of a device (neither shown). The connection to the trace (sometimes called trace lines) may be accomplished through wire bonding 76. The wire bonding technique can best be seen in FIGS. 25 and 26, and will be described further below.

The other end 78 of the conductive member 66 is inserted through its corresponding through-hole 62 from the backside of the die. By inserting the conductive member 62 through a corresponding through-hole from the back-side of the die, end 78 may be flush or nearly so with front-side die surface 58 and active circuitry top surface 60. This conductive member end 78 at the top surface of the die is connected to make contact with an electrical interconnect pad 80 that is connected to the active circuitry 56 of the IC or die. With the post conductive members, this is accomplished through soldering, and illustrated by solder bead 82. The micro-spring conductive member has a conductive cap or plug 77, which makes contact with the interconnect pad 80.

Figure 18:
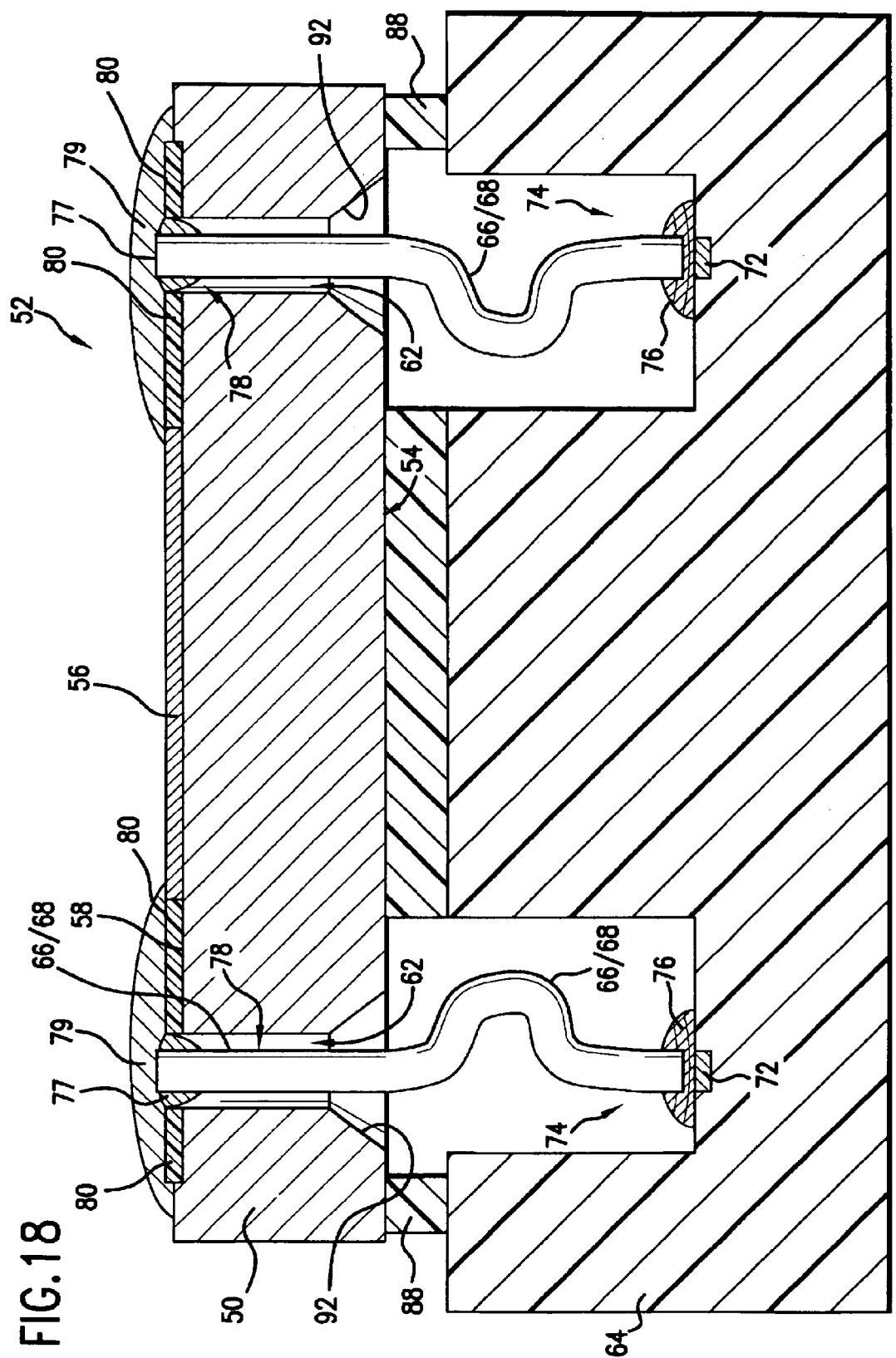
FIG. 18 is a section view disclosing a fourth embodiment.
Figure 19:
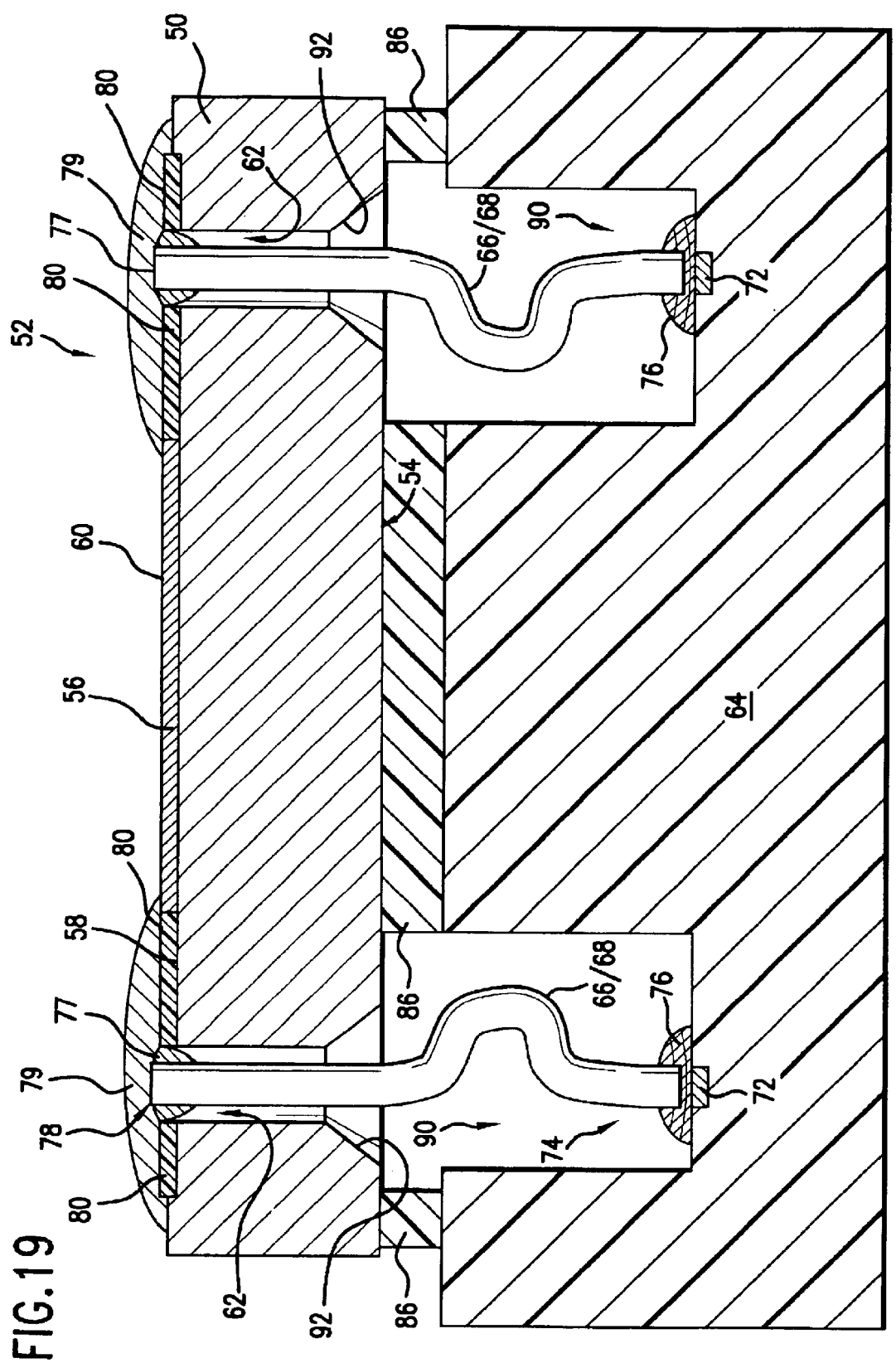
FIG. 19 is a section view disclosing a fifth embodiment.
Figure 20:
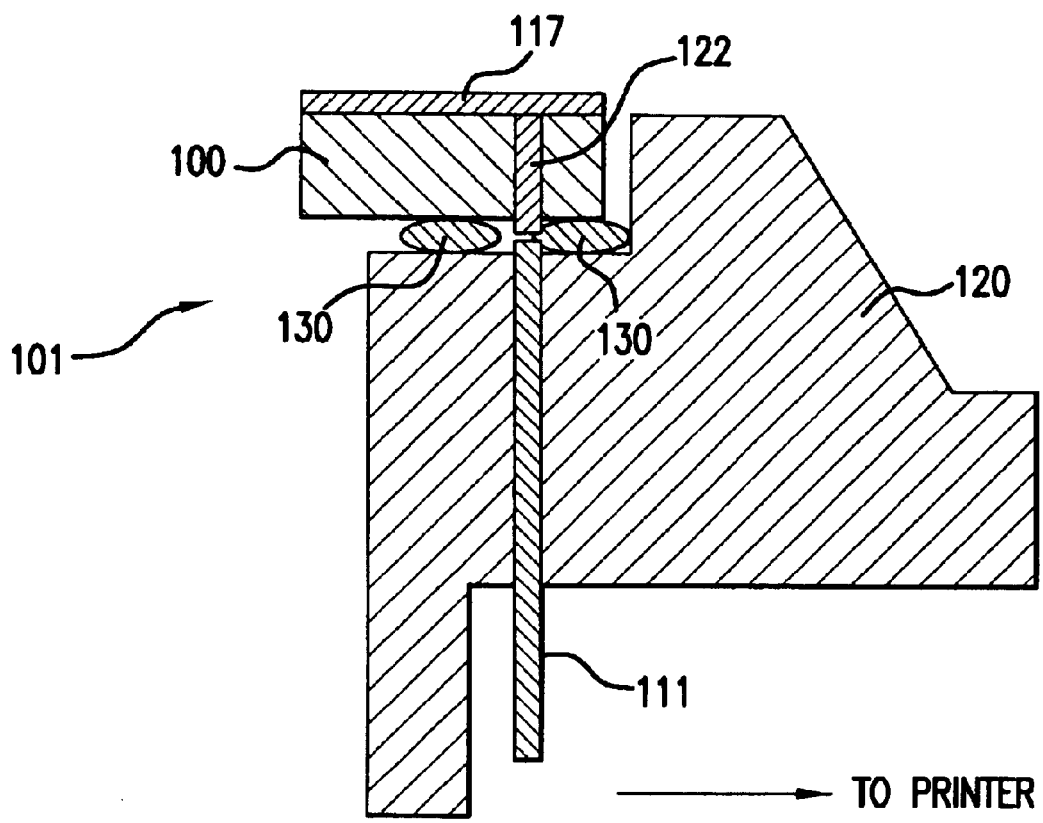
FIG. 20 is a section view of a printhead embodiment of the present invention and illustrating a printhead die with active circuitry, a substrate, a conductive member that connects the die to the substrate, and the seal between the die and the substrate, and a copper pin to connect to the printer.
Figure 21:
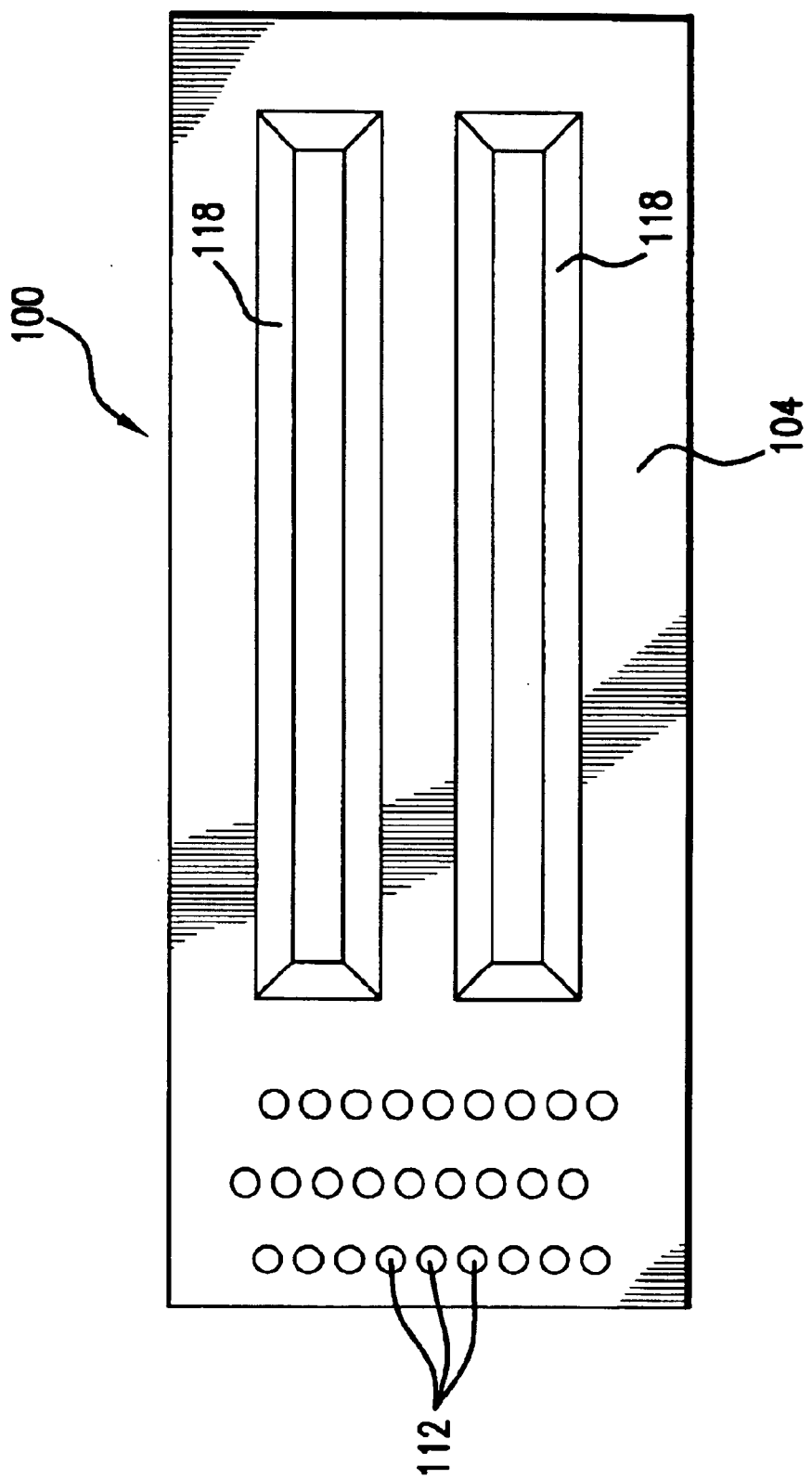
FIG. 21 is a bottom plan view of the die of the present invention as used in thermal inkjet printhead.

Each interconnect pad 80 is hermetically sealed, or nearly so, at the surface of the die. In one form, passivation 79 is used to hermetically seal the interconnect pads where the micro-spring plug or cap 77 is compression fit into the through hole, such as shown in FIGS. 18–19. Alternatively, encapsulation 81 could be used where solder 82 is used to contact the interconnect pads 80, such as shown in the species embodiment of FIGS. 15–17.

A layer of adhesive 84 is used to physically bond the back-side of the die to the substrate in one embodiment, such as shown in FIGS. 14–15. The adhesive also acts as a sealant to protect the conductive members and conductive trace lines from corrosive or otherwise damaging contaminants. In another embodiment, a hard inorganic seal 86, such as solder or anodic bond, such as shown in FIGS. 16–17 may be used. In yet another embodiment, underfill 88 (FIG. 18), such as a non-conductive polymer, may be also used to bond and seal the die to the substrate as well as protect the electrical connections.

Figure 26:
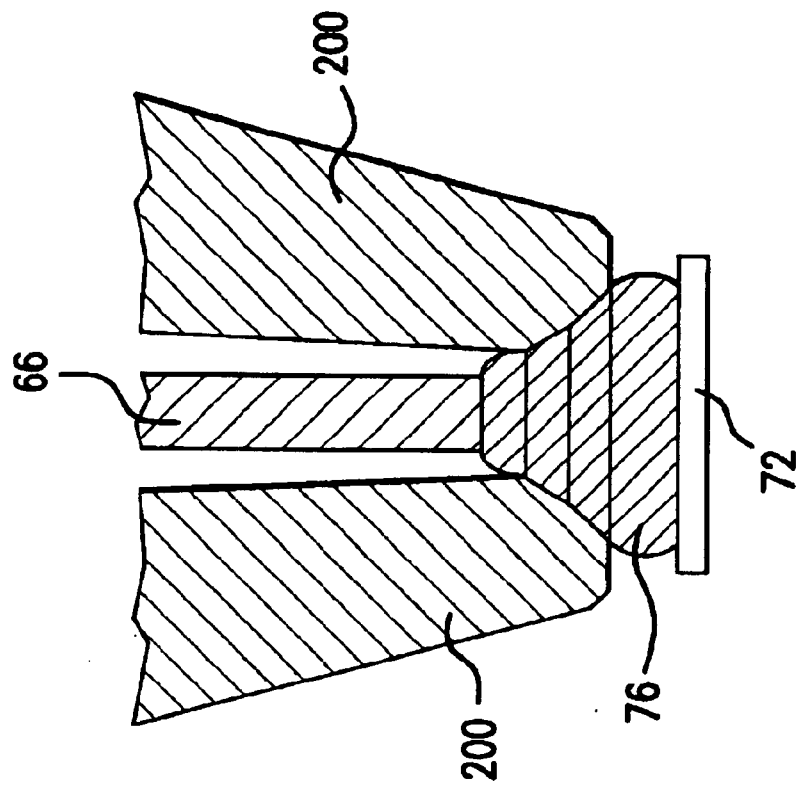
FIG. 26 is a schematic view of the tool of FIG. 25 bonding the end of the conductive member and gold ball to the trace.
Figure 25:
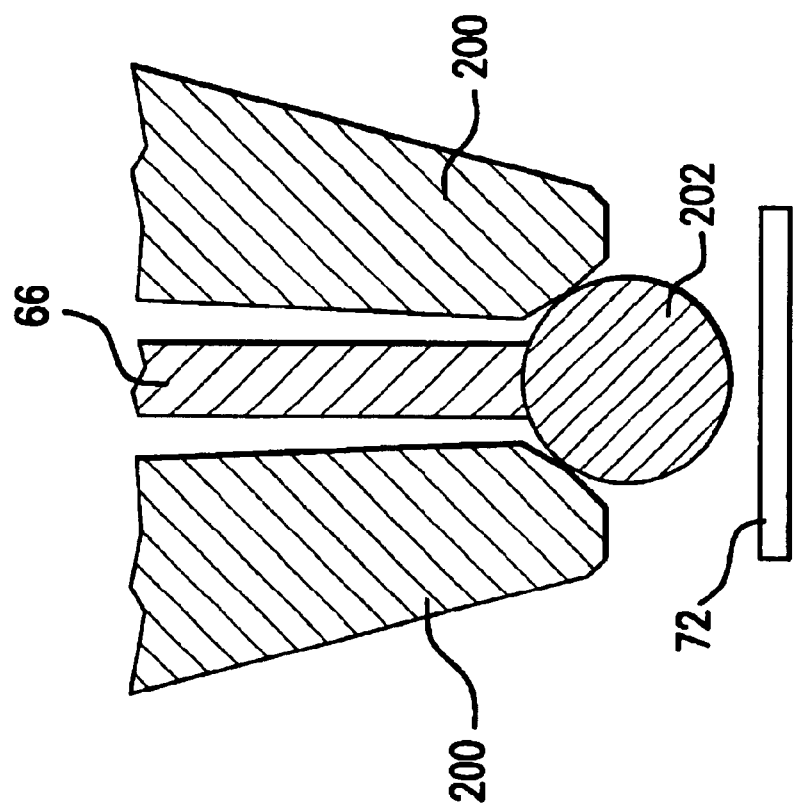
FIG. 25 is a schematic view illustrating a tool holding a conductive member post and gold ball during the wire bonding technique for electrically connecting an end of a post wire to the trace.

One end of each conductive member is bonded to a corresponding trace via a wire bonding technique, as discussed briefly above. Referring to FIGS. 25 and 26, a capillary 200, or ceramic bond tool, holds the conductive member 66. An electrical spark arcs to a gold wire tail hanging below the capillary to form a ball 202 at the end of the wire (FIG. 25). The ball is captured at the tip of the capillary. The capillary then applies a force and ultrasonic energy to a heated substrate over a defined time interval, thus, welding the ball 202 to a trace on the substrate, or through an intermediate bonding pad.

The resulting "package" (bonded die and substrate) of the present invention has a shallow profile height, especially in the embodiments illustrated in FIGS. 15 and 17. This shallow profile makes the present invention ideally suited for small/thin product applications.

As best exemplified in FIGS. 16 and 18, the substrate may include channels 90 in which to accommodate a longer post 70 or micro-spring wire 68, where needed. The substrate 64 does not need to have a planar top surface, such as shown in FIGS. 14–15 and 17 in order to sufficiently bond and seal to the die.

The through-holes 62 may be beveled (enumerated at 92) at the backside 54 of the die 50. The front-side of the through-hole may be beveled as well to accommodate the compression fit of the micro-spring on the front-side of the die. The beveling makes it easier to insert the conductive member 66 into the through-hole. Additionally, the conductive members, as well as the integrity of the electrical connection between the die and the substrate, are less likely to suffer damage in package assembly.

The present invention is ideally suited for thermal inkjet printer technology. Referring now to FIGS. 20–24, the die 100 of the present invention for a thermal inkjet is much like the die discussed above for semiconductor applications in which the die includes a front-side 102, back-side 104, an IC 106 positioned within the front-side of the die, with a front surface 108 nearly co-planar with the top surface 110 of the die. Here, the die would be incorporated into a pen assembly or printhead 101 that would be part of, and connected to, a thermal inkjet printer (connector shown at 111 in FIG. 20) in which the printhead would be moved relative to print media (or, the print media moved relative to the printhead) where ink dispersed from the printhead would be arranged on the print media in some desired fashion.

The die also includes a plurality of through-holes 112, which are preferably drilled by laser ablation. As above, alternate methods, such as electro-chemical etching, dry etching, or sand drilling, may also be used. The IC is part of a fluid-ejecting substrate 113 that further includes nozzles 114 and photo-epoxy barriers 116 to form an orifice plate 117. The fluid-ejecting substrate ejects droplets of ink 115 through the nozzles 114 on to print media. From the back-side 104 of die 100, ink feed slots 118 are incorporated to accept ink that is fed from a reservoir (not shown) and ultimately dispersed as ink droplets 115 from the nozzles 114 onto the print media.

Similar to the discussion above related to semiconductor technology, the bonding of the die 100 to a substrate 120 (or die carrier), to which the electrical connection is made relative to the signals sent to the fluid-ejecting substrate, requires no TAB circuit bonding or individual (single point) TAB bonds. The die of the present invention can be bonded directly to the die carrier, whether ceramic or LCP plastic.

Figure 22:
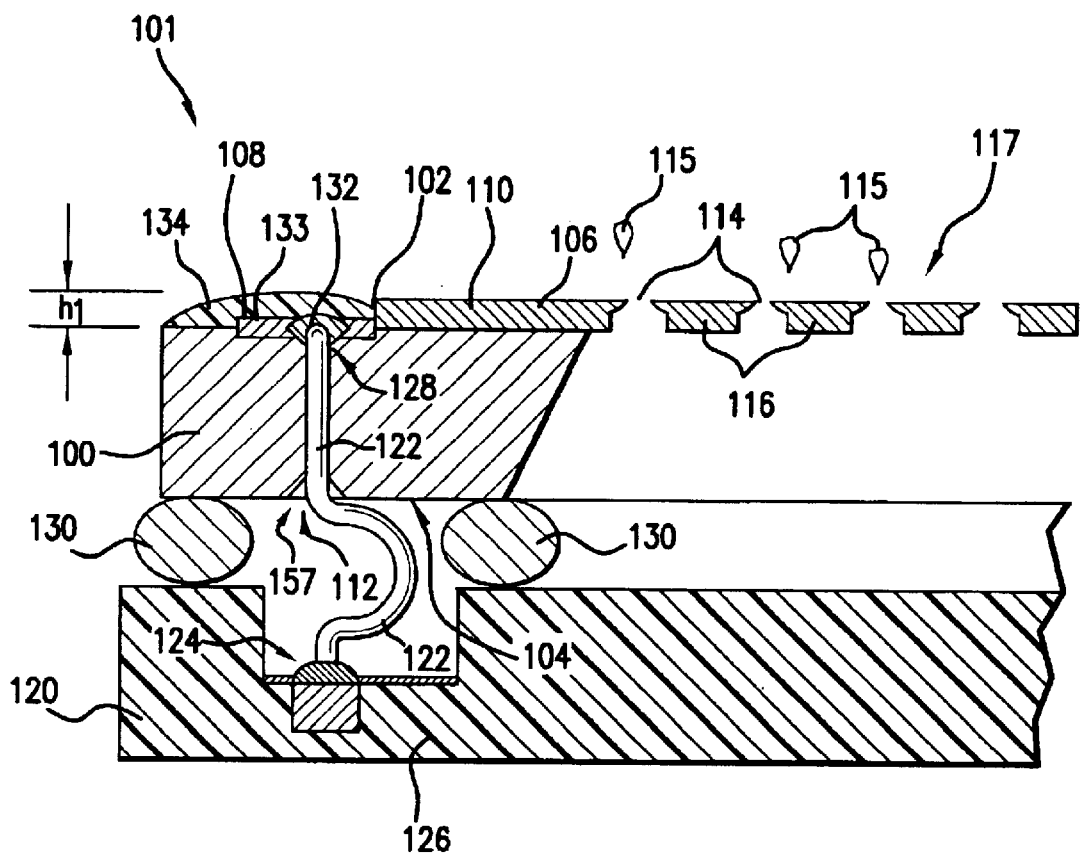
FIG. 22 is a section view of a first embodiment of a connection between a die and a substrate of a thermal inkjet printhead.

In the first embodiment of the thermal inkjet printhead species, which is shown in FIG. 22, a coated gold micro-spring conductive member 122, such as one made under the trademark FORMFACTOR, is used to connect die 100 to substrate 120. One end 124 of micro-spring 122 is connected, such as through a wire bonding technique as described above, to a conductive trace 126. The other end 128 of micro-spring 122 is inserted into a through-hole 112 through the back-side 104 of die 100.

In this embodiment, the die is bonded to the substrate through a hard inorganic seal, such as solder, shown at 130. The hard inorganic seal 130 not only bonds the back-side 104 of die 100 to die carrier 120, but the seal 130 also protects the micro-spring 122 from corrosive contaminants, such as ink from the ink reservoir (not shown).

End 128 of the micro-spring 122 that extends (slightly) through die 100 above front surface 108 of die 100 is compressed against conductive plug or cap 132, which contacts the interconnect pad 133, and, in turn, is electrically connected to the active circuitry of die. In this embodiment, passivation 134 is used to hermetically seal the cap 132 and interconnect pad 133 and keep them free from contaminates (e.g. corrosive ink) and from corroding or otherwise contaminating the electrical connection between the die and the substrate.

Figure 23:
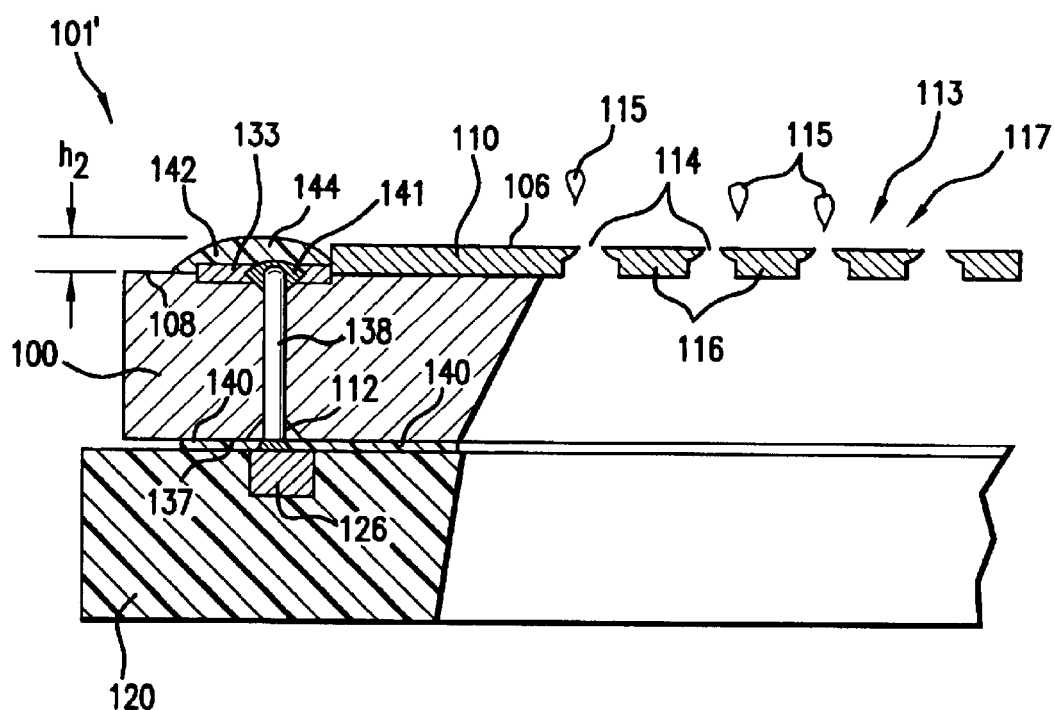
FIG. 23 is a section view of a second printhead embodiment.
Figure 27:
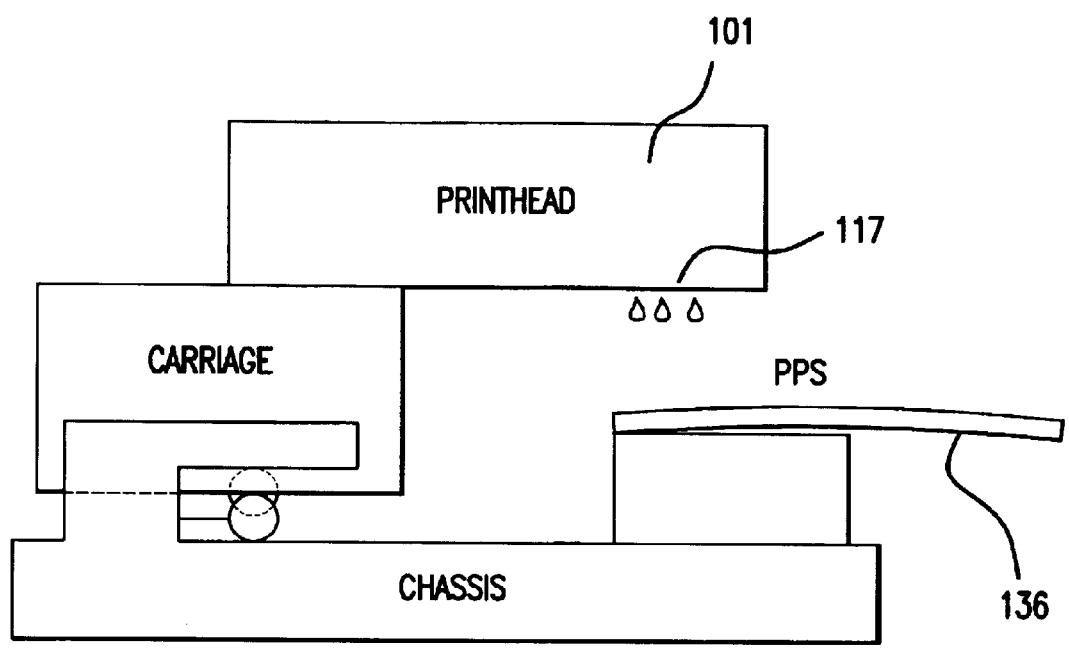
FIG. 27 is a schematic view depicting the pen to paper spacing relationship in the printhead die/substrate connection method of the present invention.

Because the micro-spring does not require solder, and, therefore, no encapsulation, the resulting profile height $h_1$ is less than the profile height of the embodiment with encapsulation (see $h_1$ in FIG. 22 and $h_2$ in FIG. 23). Moreover, because the back-side insertion of the electrical connection provides another minimal profile height of the micro-spring end insertion above the front-side surface 108, the overall height $h_1$ from the front-side surface to the highest part of the passivation sealant is no more than 0.05 mm. The highest part of the passivation sealant is substantially in the same plane as the upper surface of the nozzle/orifice plate. This shallow profile of the overall printhead die/nozzle orifice plate allows the printhead to be spaced as optimally close (in the range of 0.5 mm and still accounting for paper cockle and the like) to the print media. This close printhead-to-print media range is highly desired as it improves print quality. FIG. 27 shows schematically the spacing relationship between the printhead 101 and print media (e.g. paper) 136.

The through-holes 112 may be beveled, as shown at 137, in order to make the insertion of the micro-spring into the back-side of the through-hole easier. Beveling the through-holes at the front surface of the die makes it easier to compression fit the cap or plug 132.

A second embodiment of the printhead 101' is shown in FIG. 23. It is similar to the embodiment shown in FIG. 22, except that a straight-post conductive member 138 is used in place of the micro-spring. The post is preferably an insulated wire lead. Here, an adhesive 140 is used to seal the die 100 to the die carrier 120. Inorganic solder or anodic bond can also be used as the sealing means. Solder 141 electrically connects the post to the interconnect pad 133, which is connected to the active circuitry (the fluid-ejecting substrate) of the die. In the second embodiment, an encapsulant 142 is used to seal solder and the interconnect pad (as well as the integrity of the electrical connection from interconnect pad to conduct trace), from contaminants. The resulting encapsulant bead 144 has a profile height $h_2$ that extends slightly beyond the nozzle/orifice plate 117 of the fluid-ejecting substrate. However, because the post 138 needs to extend past the die surface 108 only minimally given its back-side insertion, the pen to paper spacing can still be within a 0.1 mm range, which is still desirable over conventional TAB bonding.

Figure 24:
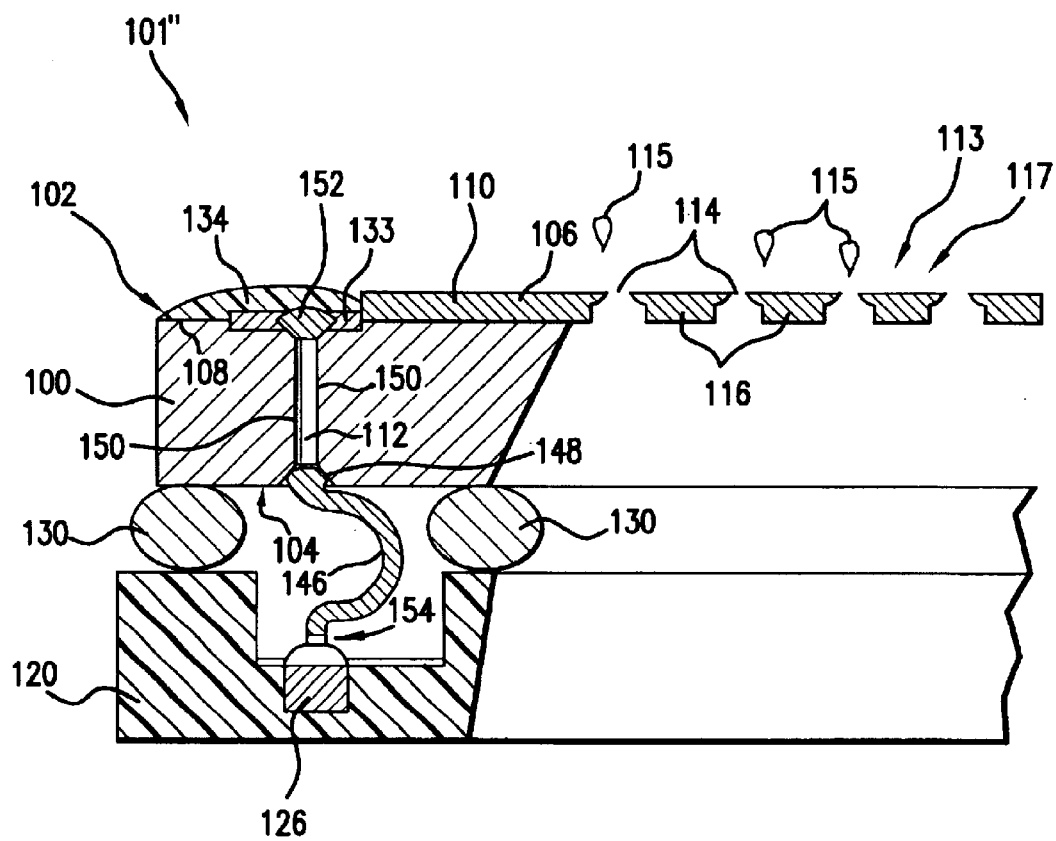
FIG. 24 is a section view of a third printhead embodiment.

A third embodiment of the printhead 101" is shown in FIG. 24. In this embodiment, one end 148 of a shortened coated spring 146 is biased against the beveled through-hole 112. Conductive material forms a side wall 150 of the through hole. A conductive cap 152, which may be similar to cap 132 in the first printhead embodiment, is biased into a beveled opening of the through hole at the front surface of the die. When the other end 154 of the micro-spring 146 is connected, such as by the afore-mentioned wire bonding technique to the trace 126, the die is electrically connected to the substrate via the trace, micro-spring, conductive side wall, and conductive cap. Passivation 134, such as described in the first printhead embodiment, may be used to hermetically seal the resulting interconnect pad 133 and the conductive cap 152. Here, similar to the first printhead embodiment, the same hard inorganic seal 130 may be used to bond and seal the back-side 104 of the die 100 to the die carrier 120.

In manufacture, the ink feed trenches of the back-side of the die are etched, such as through wet etch bend fabrication, or otherwise formed in other conventional ways. The through-holes are then laser drilled (ablated) such as by a YAG Laser of 355 UV laser at the interconnect pads. Any processing of the circuitry is finished. The substrate and die are separated by sawing, such as through a dual dicer saw, similar to the wafer separation in semiconductor technology. The insulated (coated) pins, such as micro-springs or posts, are inserted and the final printhead is assembled, including the bonding and sealing methods of the one of the three printhead embodiments discussed above. Electrical testing is conducted before final pen assembly and usage.

Benefits of the present invention allow superior bonding and sealing of dies to substrates, especially as used in thermal inkjet printer applications, without the need for adhesive laden TAB circuits. The pen assembly of the present invention provides additional protection to conductive trace lines from highly corrosive ink. Moreover, the back-side die pin insertion and direct connection to the substrate allows closer pen to paper spacing, which leads to improved print quality.

The illustrated embodiments are only examples of the present invention and, therefore, are non-limitive. It is to be understood that many changes in the particular structure, materials, and features of the invention may be made without departing from the spirit and scope of the invention. Therefore, it is the applicant's intention that its patent rights not be limited by the particular embodiments illustrated and described herein, but rather by the following claims interpreted according to accepted doctrines of claim interpretation, including the Doctrine of Equivalents and reversal of parts.

What is claimed is:

1. A method for connecting a die having active circuitry to a substrate, the die including a back-side and a front-side where the active circuitry is positioned, and the substrate includes at least one conductive trace, the method comprising:

forming at least one through-hole between the front-side and back-side of the die to correspond with a trace on the substrate;

inserting an insulated micro-spring in each formed through-hole, wherein one end of the insulated micro-spring is electrically connected to a trace on the substrate, and the other end of the insulated micro-spring is inserted into the through-hole such that the insulated micro-spring is positioned through the die and is exposed at the front-side of the die and electrically connected to the active circuitry via an interconnect pad;

bonding and sealing the back-side of the die to the substrate about the at least one insulated micro-spring; and sealing the interconnect pad and exposed end of the insulated micro-spring to substantially hermetically seal the resulting electrical connection from the active circuitry to the trace.

2. The method according to claim 1, wherein the back-side of the die is bonded and sealed to the substrate through a hard inorganic seal.

3. The method according to claim 1, wherein the back-side of the die is bonded and sealed to the substrate through an adhesive seal.

4. The method according to claim 1, wherein the back-side of the die is bonded and sealed to the substrate through an anodic bond.

5. The method according to claim 1, wherein the interconnect pad is substantially hermetically sealed through passivation.

6. The method according to claim 1, wherein the interconnect pad is substantially hermetically sealed through encapsulation.

7. The method according to claim 1, wherein each through-hole is beveled at the back-side of the die.

8. The method according to claim 1, wherein each through-hole is beveled at the front-side of the die.

9. The method according to claim 8, wherein each through-hole is beveled at the front-side of the die.

10. A method for connecting a die having active circuitry to a substrate, the die including a back-side and a front-side, and the substrate includes at least one conductive trace, the method comprising:

forming at least one through-hole between the front-side of the die to the back-side of the die to correspond with a trace on the substrate, each said through-hole is defined by an electrically conductive side wall;

providing an insulated micro-spring for each formed through-hole, wherein one end of the insulated micro-spring is electrically connected to a trace on the substrate, and the other end of the insulated micro-spring is biased against its corresponding through-hole at the back-side of the die to make contact with the electrically conductive side wall;

providing an electrically conductive cap for each through-hole such that each cap makes electrical contact with the side wall of the through-hole at the front-side of the die to contact an interconnect pad is connected to the active circuitry in the die;

bonding and sealing the back-side of the die to the substrate about the at least one insulated micro-spring; and sealing the interconnect pad and the cap to substantially hermetically seal the resulting electrical connection from the active circuitry to the trace.

11. The method according to claim 10, wherein the insulated micro-spring is an insulated truncated micro-spring.

12. The method according to claim 10, wherein the back-side of the die is bonded and sealed to the substrate through a hard inorganic seal.

13. The method according to claim 10, wherein the interconnect pad is sealed by passivation.

14. A method for connecting a die to a substrate that includes a conductive trace, wherein the die includes a back-side and a front-side, and wherein the die includes active circuitry that is positioned at the front-side, the method comprising:

forming at least one through-hole between the front-side and the back-side of the die;

inserting a conductive member in the through-hole, wherein an end of the conductive member is electrically connected to a trace on the substrate, and an other end of the conductive member is inserted into the through-hole such that a portion of the conductive member extends above the front-side of the die;

electrically connecting the portion of the conductive member extending above the front-side of the die to the active circuitry positioned at the front-side of the die; and fixing the back-side of the die to the substrate.

15. The method of claim 14, wherein the die is a constituent component of an inkjet printhead.

16. The method of claim 14, wherein the conductive member includes a micro-spring.

* * * * *